United States Patent
Ebner et al.

(10) Patent No.: US 9,618,182 B2
(45) Date of Patent: Apr. 11, 2017

(54) LIGHT-INFLUENCING ELEMENT FOR INFLUENCING THE LIGHT EMISSION OF ESSENTIALLY POINT LIGHT SOURCES

(75) Inventors: Stephan Ebner, Dornbirn (AT); Patrik Gassner, St. Gerold (AT)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 37 days.

(21) Appl. No.: 14/131,628

(22) PCT Filed: Jul. 5, 2012

(86) PCT No.: PCT/EP2012/063181
§ 371 (c)(1),
(2), (4) Date: Feb. 10, 2014

(87) PCT Pub. No.: WO2013/020762
PCT Pub. Date: Feb. 14, 2013

(65) Prior Publication Data
US 2015/0036334 A1    Feb. 5, 2015

(30) Foreign Application Priority Data

Jul. 8, 2011   (DE) .................. 10 2011 078 865
Oct. 27, 2011  (DE) .................. 10 2011 085 291

(51) Int. Cl.
*F21V 1/00*   (2006.01)
*F21V 5/04*   (2006.01)
(Continued)

(52) U.S. Cl.
CPC .......... *F21V 5/048* (2013.01); *B29C 45/0003* (2013.01); *B29C 45/16* (2013.01); *B29D 11/0048* (2013.01); *F21K 9/60* (2016.08); *F21V 5/007* (2013.01); *F21V 5/04* (2013.01); *F21V 7/0066* (2013.01); *G02B 19/0066* (2013.01);
(Continued)

(58) Field of Classification Search
CPC .................................. F21V 5/007; F21K 9/60
See application file for complete search history.

(56) References Cited

U.S. PATENT DOCUMENTS 2,215,900 A    9/1940 Bitner
2,254,962 A    9/1941 Harris et al.
(Continued)

FOREIGN PATENT DOCUMENTS

CN        1181131       5/1998
CN        101101095     1/2008
(Continued)

OTHER PUBLICATIONS

Machine Translation of JP 2008221530 A to Oshima Denki Co Sep. 25, 2008.*
(Continued)

*Primary Examiner* — Andrew Coughlin
(74) *Attorney, Agent, or Firm* — Brooks Kushman P.C.

(57) ABSTRACT

A light-influencing element for influencing the light emission of essentially point light sources having at least two lenses which are juxtaposed and integrally connected to each other, each having a cavity defining a light entrance section of the lens, and a light exit surface opposite the light entrance section, at least two of the lenses being designed differently with regard to their light entrance sections.

7 Claims, 4 Drawing Sheets

(51) Int. Cl.
| | |
|---|---|
| *F21V 5/00* | (2015.01) |
| *F21V 7/00* | (2006.01) |
| *G02B 19/00* | (2006.01) |
| *G02B 27/09* | (2006.01) |
| *H01L 33/58* | (2010.01) |
| *B29D 11/00* | (2006.01) |
| *B29C 45/00* | (2006.01) |
| *B29C 45/16* | (2006.01) |
| *F21K 9/60* | (2016.01) |
| *F21Y 101/00* | (2016.01) |
| *F21Y 103/10* | (2016.01) |
| *F21Y 115/10* | (2016.01) |

(52) U.S. Cl.
CPC .......... *G02B 27/0955* (2013.01); *H01L 33/58* (2013.01); *B29C 2045/1601* (2013.01); *F21Y 2101/00* (2013.01); *F21Y 2103/10* (2016.08); *F21Y 2115/10* (2016.08)

(56) References Cited

U.S. PATENT DOCUMENTS

| | | | |
|---|---|---|---|
| 5,485,317 A | 1/1996 | Perissinotto et al. | |
| 5,676,453 A | 10/1997 | Parkyn, Jr. et al. | |
| 6,170,971 B1 | 1/2001 | Godbillon | |
| 6,536,923 B1 | 3/2003 | Merz | |
| 6,554,451 B1 | 4/2003 | Keuper | |
| 6,724,543 B1 | 4/2004 | Chinniah et al. | |
| 6,945,674 B2 | 9/2005 | Yoneda et al. | |
| 7,349,163 B2 | 3/2008 | Angelini et al. | |
| 7,438,444 B2 | 10/2008 | Pao et al. | |
| 7,674,018 B2 | 3/2010 | Holder et al. | |
| 7,766,509 B1 | 8/2010 | Laporte | |
| 7,798,681 B2 | 9/2010 | Wang et al. | |
| 7,837,349 B2 | 11/2010 | Chinniah et al. | |
| 7,918,583 B2 | 4/2011 | Chakmakjian et al. | |
| 7,959,326 B2 | 6/2011 | Laporte | |
| 8,007,140 B2 | 8/2011 | Zhang | |
| 8,025,429 B2 | 9/2011 | Ho et al. | |
| 8,104,930 B2 | 1/2012 | Zhang et al. | |
| 8,235,547 B2 | 8/2012 | Hofmann | |
| 8,251,550 B2 | 8/2012 | Lai | |
| 8,348,461 B2 | 1/2013 | Wilcox et al. | |
| 8,348,475 B2 | 1/2013 | Wilcox et al. | |
| 8,356,916 B2 | 1/2013 | Gordin et al. | |
| 8,482,014 B2 | 7/2013 | Higuchi et al. | |
| 2005/0094393 A1 | 5/2005 | Czajkowski | |
| 2005/0135106 A1 | 6/2005 | Kittelmann et al. | |
| 2006/0050528 A1 | 3/2006 | Lyons et al. | |
| 2006/0083016 A1* | 4/2006 | Okamura | B60Q 1/0052 362/545 |
| 2006/0083023 A1 | 4/2006 | Ayabe et al. | |
| 2006/0091414 A1 | 5/2006 | Ouderkirk et al. | |
| 2006/0146531 A1 | 7/2006 | Reo et al. | |
| 2006/0268556 A1 | 11/2006 | Hsieh | |
| 2007/0195534 A1 | 8/2007 | Ha et al. | |
| 2007/0201225 A1 | 8/2007 | Holder et al. | |
| 2009/0046468 A1 | 2/2009 | Wang et al. | |
| 2009/0225543 A1 | 9/2009 | Jacobson et al. | |
| 2009/0323330 A1 | 12/2009 | Gordin et al. | |
| 2010/0038657 A1 | 2/2010 | Higuchi et al. | |
| 2010/0073938 A1 | 3/2010 | Ho | |
| 2010/0195330 A1 | 8/2010 | Schaefer et al. | |
| 2010/0284194 A1 | 11/2010 | Miyashita et al. | |
| 2010/0295071 A1 | 11/2010 | Tsai et al. | |
| 2010/0302783 A1* | 12/2010 | Shastry | F21V 5/007 362/309 |
| 2011/0063857 A1* | 3/2011 | Li | F21V 5/007 362/336 |
| 2011/0096533 A1 | 4/2011 | Sekela et al. | |
| 2011/0103051 A1 | 5/2011 | Wilcox et al. | |
| 2011/0103070 A1 | 5/2011 | Zhang | |
| 2011/0156584 A1 | 6/2011 | Kim | |
| 2012/0307504 A1* | 12/2012 | Chou | F21V 5/007 362/351 |
| 2014/0355273 A1 | 12/2014 | Saito | |

FOREIGN PATENT DOCUMENTS

| | | |
|---|---|---|
| CN | 101324317 | 12/2008 |
| CN | 101368686 | 2/2009 |
| CN | 101725852 | 6/2010 |
| CN | 101900292 | 12/2010 |
| CN | 102054925 | 5/2011 |
| CN | 102057213 | 5/2011 |
| CN | 102072457 | 5/2011 |
| CN | 201836765 | 5/2011 |
| CN | 102216677 | 10/2011 |
| CN | 102869918 | 1/2013 |
| DE | 29915907 | 12/1999 |
| DE | 10025647 | 11/2001 |
| DE | 10314357 | 10/2004 |
| DE | 102007054206 | 4/2009 |
| DE | 102009017424 | 10/2010 |
| DE | 202009007292 | 10/2010 |
| DE | 102010003805 | 10/2011 |
| DE | 102010014209 | 10/2011 |
| EP | 0635744 | 1/1995 |
| EP | 1382960 | 1/2004 |
| EP | 1548356 | 6/2005 |
| EP | 1890076 | 2/2008 |
| EP | 1998105 | 12/2008 |
| EP | 2039985 | 3/2009 |
| JP | 0737401 | 2/1995 |
| JP | 2005093622 | 4/2005 |
| JP | 2008221530 | 9/2008 |
| WO | 9833007 | 7/1998 |
| WO | 0116524 | 3/2001 |
| WO | 2007088665 | 8/2007 |
| WO | 2011015113 | 2/2011 |
| WO | 2011027267 | 3/2011 |

OTHER PUBLICATIONS

Supplemental European Search Report for EP 06746894, Completed by the European Patent Office on Sep. 25, 2009, 2 Pages.
International Search Report for PCT/EP2012/063181, English translation attached to original, Both completed by the European Patent Office on Nov. 22, 2012, All together 7 Pages.

* cited by examiner

LIGHT-INFLUENCING ELEMENT FOR INFLUENCING THE LIGHT EMISSION OF ESSENTIALLY POINT LIGHT SOURCES

CROSS-REFERENCE TO RELATED APPLICATION

This application is the U.S. national phase of PCT Application No. PCT/EP2012/063181 filed on Jul. 05,2012, which claims priority to German Patent Application No. 10 2011 078 865.4 filed on Jul. 8, 2011, and German Patent Application No. 10 2011 085 291.3 filed on Oct. 27, 2011, the disclosures of which are incorporated in their entirety by reference herein.

The present invention relates to a light-influencing element, which is provided for influencing the light emission of substantially punctiform light sources, in particular of LEDs. Furthermore, the present invention relates to a luminaire with such a light-influencing element and a method for producing such light-influencing elements.

The advances in the development of LEDs in recent years have led to such light sources being able to be increasingly used for illumination purposes. The luminous intensities that can be obtained with the aid of LEDs are now sufficiently high so that LEDs can replace previously used conventional light sources, such as e.g. incandescent lamps, fluorescent lamps or halogen lamps, in almost all fields of application. An advantage of using LEDs consists of these offering very good options for changing or modifying the light emission. Modern light sources based on LED for example, in particular, provide the option of setting the color or color temperature of the emitted light.

In principle, LEDs emit light over a relatively large solid angle. It is therefore conventional to assign optical elements, for example small reflectors or lenses, to the LEDs, by means of which optical elements the light emission is restricted or concentrated to a specific region in space. As a result of this, it is possible to ensure that the light emitted by the luminaire overall does not cause blinding of an observer or bothersome reflections on a reflecting surface, for example a screen or a tabletop.

Since individual manufacturing of lenses for influencing the light emission would be associated with extremely high outlay, use is usually made of light-influencing elements that consist of several lenses connected to one another. Here, the lenses are arranged in such a way that precisely one lens is assigned to each LED, wherein all lenses influence the light of the respective LED in an identical manner. Such light-influencing elements, which are preferably produced using an injection-molding method, are then arranged below the LEDs and then form the or one light-exit element of the luminaire.

Depending on the field of application of a luminaire, different light-emission characteristics are often desired. Conventionally, the optical elements of a luminaire are designed in such a way that the light is primarily emitted symmetrically toward the underside, in particular without blinding. By contrast, when used in a business or store, it is often necessary to illuminate shelves extending laterally along the luminaire in a targeted manner. In this case, light should increasingly also be emitted laterally, which is more likely to be avoided in other cases in order to avoid undesired blinding. Asymmetric light-emission characteristics are often also desired, for example in order to brighten adjacent walls or objects in a targeted manner.

In principle, it would be feasible for an appropriately individually designed light-influencing element to be produced for each application purpose. However, such a procedure is associated with extremely high outlay since the costs for an individual injection-molding tool are very high. A further problem also consists of the fact that, in the case of illumination systems in which a plurality of luminaires are arranged one behind the other in the longitudinal direction, the luminaires should in part have different emission characteristics while, on the other hand, a uniform appearance is desired. That is to say, although the luminaires should emit light in different ways, they should at least look very similar to an observer.

The present invention is therefore based on the object of making available a novel solution for creating suitable light-influencing elements, which, firstly, enables the adaptation of the light-emission characteristic to a desired distribution in a relatively simple manner, but secondly is associated with a justifiable financial outlay.

The object is achieved by the invention defined in the independent claims; advantageous developments of the invention are the subject matter of the dependent claims.

The main idea of the solution according to the invention is based on the discovery that it is possible to use lenses to influence the light emission, which lenses, in principle, have the same design in view of their light exit, but with it being possible to influence the light emission in a targeted manner or obtain a desired light-distribution curve by an adaptation of a light-entry region of the lens. Here, this, in particular, relates to lenses, the light-entry region of which is formed by a cavity, which is then associated to the corresponding light source, with this cavity lying opposite to the light-exit region of the lens.

Accordingly, according to the invention, a light-influencing element for influencing the light emission of substantially punctiform light sources is proposed, wherein the light-influencing element has at least two lenses which are arranged next to one another and integrally connected, which lenses each have a cavity, which forms a light-entry region of the lens, and a light-exit face lying opposite to the light-entry region and wherein, according to the invention, at least two of the lenses have different designs in respect of the light-entry regions thereof. A uniform appearance is preferably ensured by virtue of the fact that all lenses have a preferably rectangular, in particular square, light-exit face with an identical design.

The advantage of the solution according to the invention consists of the fact that modifying the light-entry region of the lenses can be carried out in a comparatively simple and cost-effective manner. To this end, provision can be made, in particular, for the light-influencing element to be produced using an injection-molding method, which requires the provision of an appropriate injection-molding tool. Here, provision is however now made for the injection-molding tool, which sets the overall structure of the light-influencing element, to be provided with one or more tool inserts, wherein the tool inserts can be interchanged and/or positioned in the injection-molding tool such that they can be changed. These tool inserts, which can be produced in different variants in a comparatively cost-effective manner compared to the whole injection-molding tool, now define the shape of the cavities, i.e. the light-entry regions of the lenses. By interchanging or different positioning of the insert or inserts, it is thus possible in a simple manner to adapt or modify the properties of the light-influencing element. This not only renders it possible to produce different light-influencing elements in a cost-effective manner, but in particular also renders it possible for the lenses to have different emission characteristics within one integrally formed light-influencing element. Despite all of this, the light-exit region of the light-influencing element is identical in all cases, and so, as previously, the desired uniform appearance is maintained.

Thus, according to the invention, a method for creating a light-influencing element is also proposed, wherein the light-influencing element has at least two lenses which are arranged next to one another and integrally connected, which lenses each have a cavity, which forms a light-entry region of the lens, and a light-exit face lying opposite to the light-entry region, and wherein, according to the invention, the light-influencing element is produced by injection molding, wherein the cavities of the lenses are each defined by a tool insert, which can be interchanged and/or positioned in the injection-molding tool such that they can be changed. As already mentioned, the tool insert can in this case be positioned in the injection-molding tool with different orientations, wherein, additionally or alternatively, there also is the option of using tool inserts with different designs. Furthermore, the invention also relates to a corresponding injection-molding tool.

The lenses of the light-influencing element according to the invention preferably substantially have a frustum-like design, wherein—once again for obtaining an appearance that is as uniform as possible—the lateral faces of the lenses can have an identical design. The cavities of the lenses can—depending on the desired light-emission characteristic—have a polygonal cross section or a rotationally symmetric design. Here, the light-emission characteristic can, in particular, be adapted by virtue of the base areas of the cavities being modified in a corresponding manner. Thus, by way of example, a beam splitter can be realized by the introduction of a notch, by means of which a broader distribution or even splitting of the emitted light is achieved. The orientation of this notch can also be adapted accordingly, depending on application, wherein it would by all means also be feasible for notches to have different orientations within a single light-influencing element.

By an appropriate design of the tool insert, there is, in particular, also the option of directing the light emission in a specific direction. By way of example, if the light-entry regions of the lenses are designed in such a way that an asymmetric light emission is obtained, the direction of the light emission can be influenced in a targeted manner by an appropriate adaptation of the orientation of the lenses. This renders it possible to direct light to a specific side in a targeted manner and, for example, form what is known as a wallwasher. By contrast, by an alternating arrangement of appropriately designed lenses, a uniform light emission in different directions could in turn be realized. In all these variants, the corresponding light-influencing elements can be produced in a comparatively simple and cost-effective manner.

In the following text, the invention is to be explained in more detail on the basis of the attached drawing. In detail:

Figure 6:
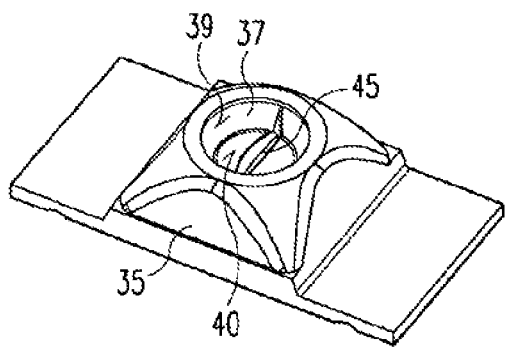
FIGS. 6 and 7 show a second embodiment of a lens.
Figure 7:
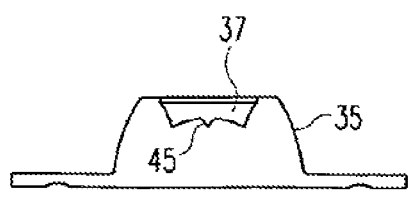
Figure 8A:
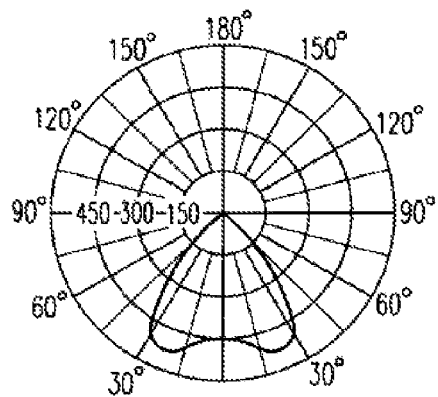
Figure 8B:
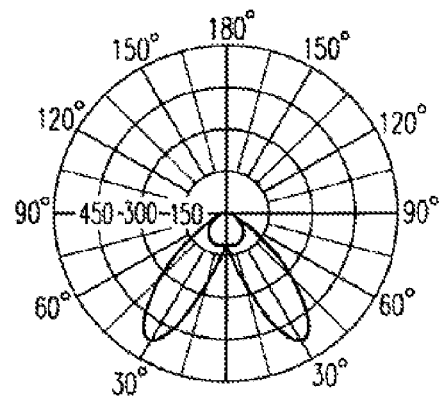
Figure 9:
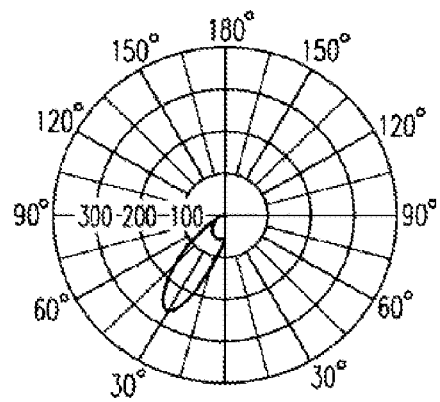
Figure 9:
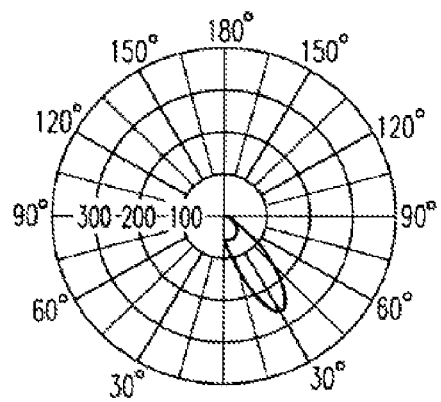
Figure 9:
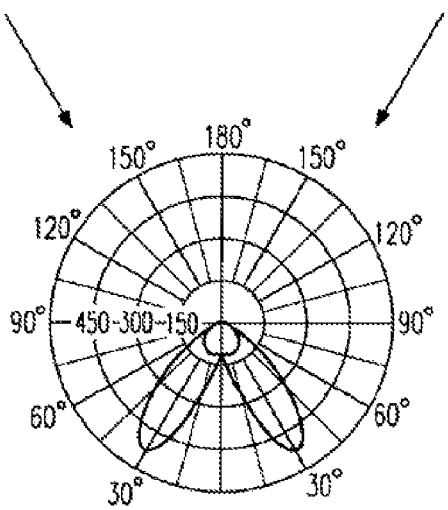
Figure 10:
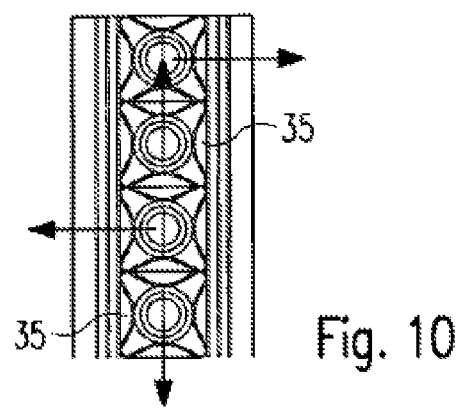
Figure 11:
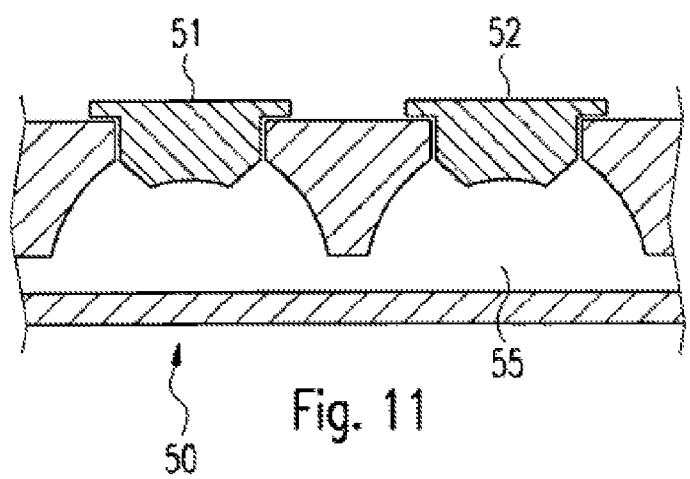

FIGS. 8*a* and 8*b* show light-distribution curves of the lenses from FIGS. 4 to 7;

FIG. 9 shows the schematic procedure for obtaining a symmetrical light distribution when using asymmetrically designed lenses;

FIG. 10 shows a possible variant for the simultaneous use of lenses with asymmetric light emission and FIG. 11 shows a schematic depiction of the production according to the invention of the light-influencing elements.

Before the embodiment and production of the light-influencing elements according to the invention are explained in more detail, an exemplary embodiment of a luminaire, in which such light-influencing elements are preferably used, is to be described initially. This luminaire depicted in FIGS. 1 and 2 and generally provided with the reference sign 1 is a batten luminaire, i.e. a luminaire with an elongate design, which is provided for use in a busbar system. However, the light-influencing elements according to the invention are by no means restricted to use in such ceiling luminaires but can naturally also be used in other luminaires, which are not provided for connection to a busbar system. In particular, this also includes wall luminaires and floor luminaires.

Firstly, the luminaire 1 has an elongate profile body 2 as supporting element, which can, for example, be embodied as aluminum extrusion profile. The profile body 2 consists of two sidewalls 3 and 4, which extend parallel to one another and which are connected to one another by a central limb 5. Anchored in the upper region of the profile body 2 is the rotary tapping 10, which enables what is known as a mechanical attachment of the luminaire 1 on a support rail 100 and furthermore the contacting of lines extending within the support rail 100. To this end, the rotary tapping 10 has corresponding projections 11 and contacts 12, which are pivoted out laterally by rotation and, as a result of this, engage behind projections on the support rail 100 or come into contact with corresponding conductors. Such rotary tappings are already known, with reference in this respect being made, for example, to DE 10 025 647 A1 by the applicant, which describes a corresponding busbar system.

As mentioned previously, LEDs are used as light sources in the present case. To this end, a plurality of LED modules 20 are arranged one behind the other in the longitudinal direction on the underside of the central limb 5 of the profile body 2, which LED modules each have an elongate printed circuit board 21 and LEDs 22 arranged thereon. In the case of a luminaire of a conventional length, approximately four to five such LED modules 20 are generally arranged one behind the other in the longitudinal direction. These LED modules are preferably attached to the central limb 5 by adhesive bonding, with, however, a screwed or latching connection also being feasible. In particular, there should be good thermal contact between LED module 20 and central limb 5, in order to enable effective dissipation of the heat occurring during the operation of the LEDs 22. It should be noted that the term LEDs in the present case should be understood to mean both individual LEDs and LED clusters, for example an RGB arrangement.

Figure 3:
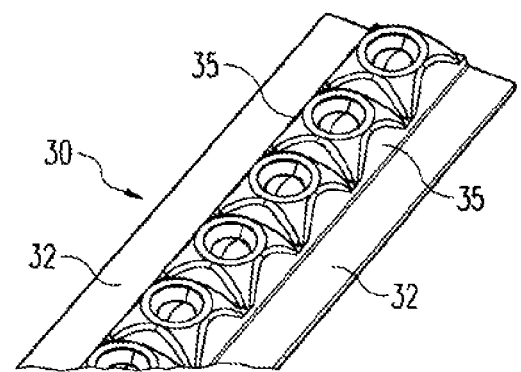
FIG. 3 shows the view of a first exemplary embodiment of a light-influencing element according to the invention.
Figure 4:
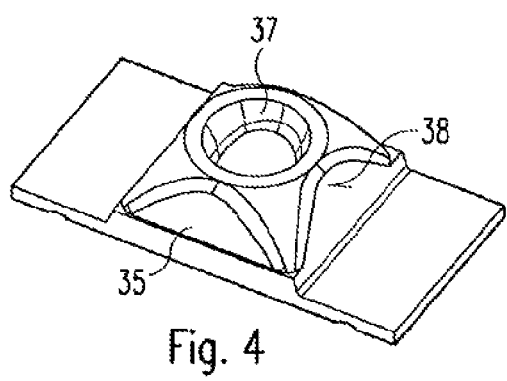
FIGS. 4 and 5 show views of the lenses used in the light-influencing element of FIG. 3.
Figure 5:
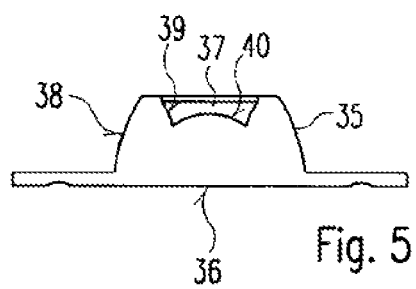

The light emitted by the LEDs 22 is radiated with the aid of a light-influencing element 30, the embodiment of which can, in particular, be gathered from FIGS. 3 to 5.

The light-influencing element 30 consisting of a transparent plastics material has an elongate design and has a central middling region 31, which is formed by a plurality of lenses 35 arranged one behind the other in the longitudinal direction. The dimensions and arrangement of the lenses 35 are such in this case that an individual lens 35 is assigned to each LED 22. The light-influencing element 30 with an integral design preferably has a length corresponding to an LED printed circuit board 20. With the aid of two laterally protruding arms 32, which are preferably likewise transparent, it is possible to attach the element on the profile body 2; for example, it can be clamped to the latter.

The embodiment of the individual lenses 35 can, in particular, be gathered from FIGS. 4 and 5. Here, each lens 35 has an approximately frustum-like design and, on its underside, has a rectangular, preferably square, base area, which forms the light-exit face 36 and by means of which the light is ultimately emitted. A recess or cavity 37, the circumferential face and base area of which form the light-entry region of the lens 35, is arranged on the side of the lens body lying opposite to the light-exit face 36.

Figure 1:
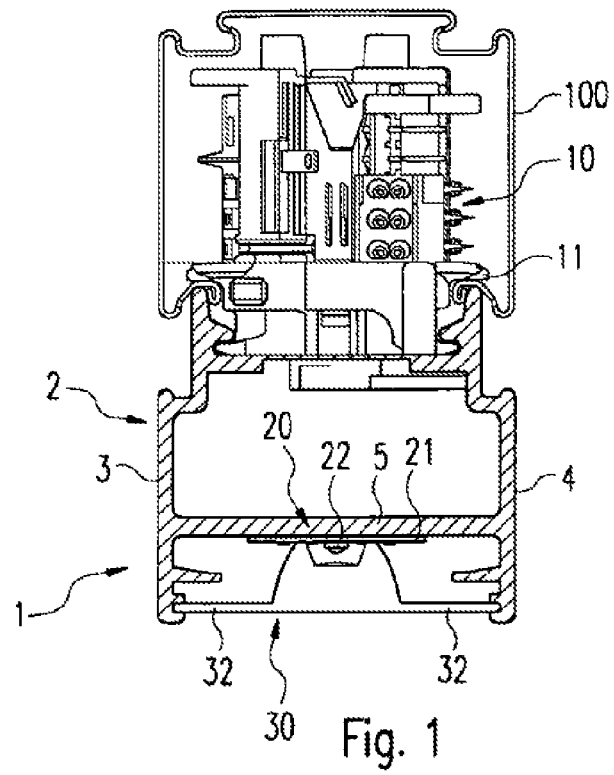
FIGS. 1 and 2 show views of a luminaire, in which use is made of light-influencing elements designed and produced according to the invention.
Figure 2:
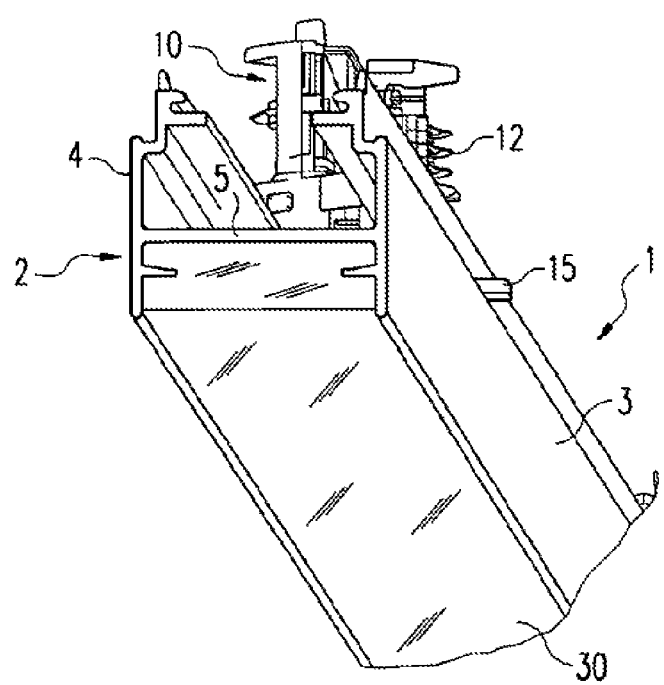

As can be gathered from the depiction of FIG. 1, the LED 22 slightly protrudes into the associated cavity 37 in the assembled state of the light-influencing element 30 on the profile body 2. Since the light from the LED 22 is emitted substantially rotationally symmetrically over a very broad solid angle, the light is coupled into the lens body both over the base area and over the lateral face of the cavity 37. Some of the light in this case directly reaches the light-exit face 36 and is emitted by the latter. By contrast, a further part of the light undergoes total internal reflection on the lateral face 38 of the frustum-like lens body and is directed onto the light-exit face 36 in this manner.

In the depicted exemplary embodiment, the cavities 37 of the lenses 35 have rotationally symmetric designs. They have slightly bent side faces 39 and an arced base area 40. In such an embodiment, a light distribution as depicted schematically in FIG. 8a is obtained. It is possible to identify that there is a concentrated light emission directly toward the underside. By way of example, such light emission is desired if blinding of persons situated in the vicinity of the luminaire should be avoided at flat viewing angles.

By contrast, if the luminaire is used in a business setting, for example between two rows or walls of shelves extending parallel to one another, it is often more likely the case that a light distribution is desired as depicted schematically in FIG. 8b. Thus, in this case, less light should be emitted directly downward, but it should rather be additionally emitted into two lateral regions lying opposite to one another.

In order to realize such a different light-distribution curve, it was necessary until now to develop a completely new light-influencing element. However, the production of a corresponding individual injection-molding tool for this was associated with a very high cost outlay.

According to the invention, a solution is now proposed which significantly simplifies the adaptation of the light-distribution characteristic. This solution is based on the discovery that the light distribution can be adapted as desired, in particular by a corresponding design of the light-entry region of the lenses 35. By contrast, the further elements of the lens 35, in particular the light-exit face 36 and the lateral face 38 of the lens body, do not need to be modified. Firstly, this leads to the advantage that, even in the case of different light-emission characteristics, the appearance of the light-influencing element remains unchanged. Furthermore, the production of a correspondingly designed light-influencing element with a modified light-distribution curve is now significantly more cost-effective.

Before the method for producing the light-influencing element 30 is explained in more detail, a lens 35 should be shown first, by means of which the light-distribution characteristic shown in FIG. 8b is obtained. This lens 35, depicted in FIGS. 6 and 7, is distinguished by virtue of the fact that the cavity 37 of the light-entry region has a notch 45. It is possible to identify that this notch 45 extends both through the base area 40 and through the circumferential face 39 of the cavity 37. A beam splitter is realized by this notch 45, which beam splitter laterally deflects or splits the incident light, which as such is emitted unhindered to the underside, so that, ultimately, the sought-after, symmetric, lateral light emission in accordance with FIG. 8b is obtained.

A further option also consists of embodying the light-entry region of a lens in such a way that an asymmetric light emission is obtained, as is depicted, for example, schematically in the upper left-hand region of FIG. 9. Such a light-emission characteristic can also be obtained by a corresponding adaptation of the cavity or the light-entry region of the lens, without the light-exit region or the shape of the lateral face of the lens body having to be adapted for this. If use is only made of such lenses with an asymmetric design, the light is only emitted laterally into the left-hand lower region and can, for example, be employed to illuminate a wall region or an object situated there. A luminaire with such a light-influencing element could thus be used as a wallwasher, with, however, an observer initially being unable to distinguish it from a luminaire with a light-emission characteristic as per FIG. 8a or 8b because, in principle, the light-influencing elements 30 have an identical design in terms of the light-exit region thereof. Naturally, the lens could, in the same way, also be designed in such a way that the light is emitted to the right-hand underside, as depicted in the right-hand upper region of FIG. 9.

However, if lenses which, on the one hand, primarily emit to the left-hand side and, on the other hand, primarily emit to the right-hand side are now used alternately within a light-influencing element, a light-beam characteristic is obtained overall as shown in the lower region of FIG. 9. Thus, a light-distribution curve which emits symmetrically to both sides and substantially corresponds to that of FIG. 8b is once again obtained.

A further option for an expedient light-influencing element is depicted in FIG. 10. Here, successive lenses 35 are in each case embodied in such a way that the asymmetric light emission—indicated schematically by an arrow—is rotated by 90° in each case. In combination, this obtains a light emission in all four main directions. Furthermore, it would also be feasible to orient the lenses embodied for asymmetric light emission in such a way that the light emission occurs along the longitudinal direction of the luminaire. As a result of this, an object or a wall in an end region of a luminaire could be illuminated in a targeted manner. A suitable field of application for this would be, for example, a blackboard lighting, wherein additional luminaires aligned perpendicular to the general illumination could be dispensed with for this.

All these exemplary embodiments clarify that the production of individually designed light-influencing elements would be very desirable. A production in the previously known manner, i.e. using the conventional injection-molding method, could however hardly be realized for financial reasons since an individual injection-molding tool would have to be provided for each variant, which would lead to very high costs.

However, as already mentioned previously, a substantial advantage of the solution according to the invention also consists of the fact that the lenses with different designs can be realized and produced in a very simple manner. This advantage is based on the fact that the design of the light-entry region of the lens can be changed or modified in a very simple manner, provided the further region of the lens body remains substantially unchanged.

According to the invention, provision is therefore made for the light-influencing element once again to be produced within the scope of an injection-molding method, i.e. in which liquid plastic is introduced into an injection-molding tool and solidified there. The void of the tool corresponds to the subsequent shape of the light-influencing element, with, however, provision now being made for the use of tool inserts, by means of which the shaping of the light-entry regions of the lenses takes place.

This idea is depicted schematically in FIG. 11, which schematically shows an injection-molding tool 50 in cross section, which forms the void 55 for creating the light-influencing element. Here, the void 55 is substantially defined by the injection-molding tool 50, with, however, provision additionally being made for male molds or tool inserts 51, 52 which can be positioned differently and/or interchanged. These male molds or inserts 51, 52 are positioned in the tool 50 in such a way that they restrict the void 55, which should be filled by the plastics material, in that region which forms the subsequent cavity, i.e. the light-entry region for the associated lens. Compared to the whole injection-molding tool 50, such inserts 51, 52 can be produced comparatively cost-effectively, with it now being optionally possible for the tool 50 to be equipped with different inserts 51 or 52, for example in order to produce lenses as depicted in FIGS. 3 to 5, or lenses in accordance with the depictions in FIGS. 6 and 7.

That is to say, proceeding from a light-emission characteristic, as depicted in FIG. 8a, it is very simple to change to an emission characteristic in accordance with e.g. FIG. 8b by virtue of the male molds or inserts 51, 52 in the tool being replaced such that the light-entry region of the lenses is adapted and provided with the notch-like recess. The external appearance of the lenses, in particular size and shape, remain unchanged, but a significantly modified emission characteristic is obtained.

Inserts, by means of which an asymmetric light emission is obtained, would also be feasible, wherein, in this case, it is then also possible for provision to be made for such inserts to be arranged with different orientations in the tool 50 in order—as explained in conjunction with FIGS. 9 and 10—to obtain a light emission in a different direction in each case.

It can be seen that light-influencing elements with a specific desired light-emission characteristic can easily be obtained in the case of such a procedure. Here, it is also feasible, in particular, for the individual lenses of a light-influencing element with an integral design to have different designs. In this case, a very individual adaptation of the light-emission characteristic of the whole light-influencing element can be obtained, with the provision of an injection-molding tool which is specifically provided for this not being required here. It can be seen that such a solution is very cost-friendly.

However, cost advantages are obtained even for the case in which the lenses of an individual light-influencing element, in principle, have an identical design since, in this case too, differently designed light-influencing elements can be produced in a simple manner. As a result, it would be readily possible to use the same light-influencing elements over almost the whole length in the case of a luminaire in accordance with FIGS. 1 and 2, which light-influencing elements for example bring about a lateral light emission, but to arrange a light-influencing element at the end face, by means of which a light emission is obtained in the longitudinal direction. In addition to a cost-effective production of the different light-influencing elements, this also obtains the advantage of the light-influencing elements having a uniform appearance.

The invention claimed is:

1. A luminaire comprising:
   a plurality of substantially punctiform light sources arranged next to one another; and
   a light-influencing element for influencing light emission of the substantially punctiform light sources, wherein the light-influencing element has a plurality of lenses which are assigned to the light sources, arranged next to one another and integrally connected in one piece, which lenses each have a cavity, which forms a light-entry region of the lens, and a light-exit face lying opposite to the light-entry region,
   wherein at least two of the lenses have different designs in respect of the light-entry regions thereof; and
   wherein all lenses have rectangular flat light-exit faces with an identical design such that the light-influencing element in total has a substantially flat light-exit face.

2. The luminaire as claimed in claim 1, wherein the lenses substantially have a frustum-like design, wherein lateral faces of the lenses have an identical design.

3. The luminaire as claimed in claim 1, wherein the cavities of at least some lenses have a polygonal cross section.

4. The luminaire as claimed in claim 1, wherein the cavities of at least some lenses have a rotationally symmetric design.

5. The luminaire as claimed in claim 1, wherein the cavities of the lenses with different designs differ in the design of a base area.

6. The luminaire as claimed in claim 5, wherein the base area of at least one of the cavities has a notch.

7. The luminaire as claimed in claim 6, wherein a plurality of lenses each have a notch, which notches have different orientations.

* * * * *